(12) United States Patent
Shashkov et al.

(10) Patent No.: US 10,299,374 B2
(45) Date of Patent: May 21, 2019

(54) FLEXIBLE ELECTRONIC SUBSTRATE (71) Applicant: Cambridge Nanotherm Limited, Haverhill, Suffolk (GB)

(72) Inventors: Pavel Shashkov, Linton (GB); Sergey Usov, Cambridge (GB)

(73) Assignee: CAMBRIDGE NANOTHERM LIMITED, Haverhill, Suffolk (GB)

( * ) Notice: Subject to any disclaimer, the term of this patent is extended or adjusted under 35 U.S.C. 154(b) by 313 days.

(21) Appl. No.: 15/036,592

(22) PCT Filed: Oct. 13, 2014

(86) PCT No.: PCT/GB2014/053073
§ 371 (c)(1),
(2) Date: May 13, 2016

(87) PCT Pub. No.: WO2015/071635
PCT Pub. Date: May 21, 2015

(65) Prior Publication Data
US 2016/0302300 A1 Oct. 13, 2016

(30) Foreign Application Priority Data
Nov. 15, 2013 (GB) .................................. 1320180.1

(51) Int. Cl.
*H05K 1/02* (2006.01)
*H05K 3/00* (2006.01)
(Continued)

(52) U.S. Cl.
CPC ............ *H05K 1/028* (2013.01); *C25D 11/02* (2013.01); *C25D 11/024* (2013.01);
(Continued)

(58) Field of Classification Search
CPC .... H05K 1/028; H05K 1/0237; H05K 1/0306; H05K 1/053; H05K 3/0044; H05K 3/28; H05K 3/44; C25D 11/02; C25D 11/024
See application file for complete search history.

(56) References Cited

U.S. PATENT DOCUMENTS 4,015,987 A 4/1977 Garry .............................. 96/36.2
5,688,606 A * 11/1997 Mahulikar ............ H01L 23/142
205/105
(Continued)

FOREIGN PATENT DOCUMENTS

CN 2063334 U 10/1990
CN 1965618 A 5/2007
(Continued)

OTHER PUBLICATIONS

Notification of the First Office Action ( in English) issued by SIPO dated May 25, 2017, for Chinese Application No. 201480073097.7.
(Continued)

*Primary Examiner* — Timothy J Thompson
*Assistant Examiner* — Amol H Patel
(74) *Attorney, Agent, or Firm* — Venable LLP (57) ABSTRACT

A flexible electronic substrate (FES) includes a metallic layer, a dielectric nanoceramic layer formed by oxidation of a surface of the metallic layer, and an electrical circuit formed on a surface of the dielectric layer. The FES may be used for supporting a device, for example a flexible display, an OLED, an optoelectronic device, or a rf device. The dielectric nanoceramic layer has a crystalline structure consisting of substantially equiaxed grains having an average grain size of 100 nanometers or less, a thickness of between 1 micrometer and 50 micrometers, a dielectric strength of greater than 20 KV $mm^{-1}$, and a thermal conductivity of greater than 3 W/mK. The FES has a minimum bend radius of lower than 25 cm.

28 Claims, 2 Drawing Sheets

(51) Int. Cl.
*C25D 11/02* (2006.01)
*H05K 3/44* (2006.01)
*H05K 3/28* (2006.01)
*H05K 1/03* (2006.01)
*H05K 1/05* (2006.01)

(52) U.S. Cl.
CPC ......... *H05K 1/0237* (2013.01); *H05K 1/0306* (2013.01); *H05K 1/053* (2013.01); *H05K 3/0044* (2013.01); *H05K 3/28* (2013.01); *H05K 3/44* (2013.01); *H05K 1/05* (2013.01); *H05K 2201/0116* (2013.01); *H05K 2201/0175* (2013.01); *H05K 2203/0315* (2013.01); *H05K 2203/1147* (2013.01)

(56) References Cited

U.S. PATENT DOCUMENTS

| | | | | |
|---|---|---|---|---|
| 5,917,157 | A | 6/1999 | Remsburg | 174/252 |
| 6,919,012 | B1 * | 7/2005 | Bucar | C25D 9/04 |
| | | | | 204/230.2 |
| 9,551,082 | B2 * | 1/2017 | Shashkov | C25D 11/024 |
| 2010/0307800 | A1 | 12/2010 | Wee et al. | 174/257 |
| 2011/0192451 | A1 | 8/2011 | Sato et al. | |
| 2012/0273034 | A1 | 11/2012 | Sato et al. | 136/252 |

FOREIGN PATENT DOCUMENTS

| | | |
|---|---|---|
| CN | 103350542 A | 10/2013 |
| JP | H 11-307891 A | 11/1999 |
| JP | 2007-180083 A | 7/2007 |
| JP | 2011-181895 A | 9/2011 |
| WO | 2007/091976 A1 | 8/2007 |
| WO | WO 2008/120046 A1 | 10/2008 |
| WO | WO 2012/107754 A2 | 8/2012 |
| WO | WO 2012/107755 A1 | 8/2012 |
| WO | WO 2015/061649 A1 | 4/2015 |

OTHER PUBLICATIONS

International Search Report and Written Opinion dated Jan. 16, 2015, issued by WIPO in connection with International Application No. PCT/GB2014/053073, on which the present national-stage application is based.

International Preliminary Report on Patentability ("IPRP") dated Feb. 11, 2016, issued by WIPO in connection with International Application No. PCT/GB2014/053073, on which the present national-stage application is based.

Search Report dated Aug. 11, 2014, issued by the UK Intellectual Property Office in connection with British Application No. GB1320180.1, from which the present national-stage application claims the benefit of priority.

"Crystal Structure and Crystal Properties", H.G.F. Winkler Science Press, Aug. 31, 1960, pp. 260-262 (in Chinese).

J.A. Curran et al., "The thermal conductivity of plasma electrolytic oxide coatings on aluminum and magnesium," Surface & Coating Technology, vol. 199, pp. 177-183 (2005).

Examination Report received in corresponding GB App No. 1320180.1, issued Mar. 29, 2018 (5 pages).

Office Action received in corresponding JP App. No. 2016-531054, issued Oct. 30, 2018 (14 pages).

* cited by examiner

FLEXIBLE ELECTRONIC SUBSTRATE

TECHNICAL FIELD

The invention relates to a flexible electronic substrate (FES), for example a FES for supporting flexible displays, printed batteries, photovoltaic devices, thermoelectric devices, optoelectronic devices, electronic devices, microwave devices, or RF devices.

BACKGROUND

Displays, electronic, optoelectronic, microwave, RF, and electrical devices are typically mounted, or printed, on substrates that provide support, arrange electrical power and signal supply, and act to remove heat from the device. Flexible electronic substrates are built on a flexible material base, which normally is a polymer film or metal foil. Flexible electronic substrates (FES) are also named flexible circuits or, flexible PCBs, flex prints or flexi-circuits.

Polymer films are the most common materials used for building FESs and are typically made of a polyester (for example polyethylene terephthalate (PET)), polyimide (PI), polyethylene napthalate (PEN), Polyetherimide (PEI), or one of various fluoropolymers (FEP) and copolymers.

Flexible electronic substrates (FESs) based on polymer films are limited to application in supporting electronic devices that generate low specific heat energy, for example flexible displays, organic light-emitting diodes (OLEDs), key boards, or photovoltaic devices. Such limitations in the application of FESs are partially due to the low thermal conductivity of polymer films (lower than 1 W/mK), which does not allow dissipation of heat from electronic devices. Limitations are also partially due to low thermal, structural, and dimensional stability of polymer films.

The maximum processing temperature of many polymer materials is lower than the temperatures required for thin film transistor (TFT) fabrication, which may be greater than 300° C.

For applications that are temperature critical, such as photovoltaic devices or thermoelectric devices operating at high temperatures, or flexible displays or light sources like OLEDs in which generated heat has an adverse effect of longevity, light efficiency, colour stability, and reliability of the device, it is beneficial to provide a FES with higher thermal conductivity.

For RF and microwave applications it may be beneficial that a FES comprises a dielectric material that has a high dielectric constant as well as having a ground metal layer or metal shielding layer.

In order to provide higher processing and working temperatures, and to improve thermal properties, flexible substrates may be built on metal foils such as Steel, Titanium (Ti), or Aluminium (Al) foils, which provide high temperature stability and heat dissipation.

As illustrated by the figures in Table 1, of the above mentioned metals used as a base for FESs Al has significantly higher thermal conductivity (above 150 W/mK) and is, therefore, beneficial for thermal management.

TABLE 1

Thermal conductivity of materials used for flexible electronic substrates

| Material | Thermal conductivity (W/mK) |
| --- | --- |
| Aluminium | 150-250 |
| Steel | 15-25 |

TABLE 1-continued

Thermal conductivity of materials used for flexible electronic substrates

| Material | Thermal conductivity (W/mK) |
| --- | --- |
| Titanium | 5-23 |
| Polyimide | 0.4-0.8 |
| Polyester | 0.15-0.24 |

To form a FES having a metal foil base, a dielectric layer is applied on the metal foil surface in order to insulate it from an electrical circuit. To maintain thermal advantages of metal based FESs it is advantageous to have a non-organic dielectric layer. A dielectric layer may be applied to a metal surface by physical-vapour deposition (PVD), or chemical-vapour deposition (CVD), by jet printing, or by anodising. The presence of natural oxide layer on the surface of some metals (for example Al) can create adhesion problems for traditional deposition coatings or printing techniques. An anodising process does not present the same problem because an anodised coating is formed by electrochemical oxidation of the substrate itself.

U.S. Pat. No. 4,015,987 describes an anodised, non-flexible, Al substrate for use as an insulated metal substrate for electronic applications. The process described in U.S. Pat. No. 4,015,987 includes anodising an aluminium substrate and laminating copper foil to the anodised substrate. Photo resist, etching and plating steps follow. Anodised Al substrates have not found broad application as FESs because of the inherent low flexibility of the anodised layer. Anodised layers also have low thermal stability. Both of these deficiencies lead to formation of micro cracks in the anodic layer, which compromise the dielectric strength of the layer.

It is an aim of the invention to provide a flexible electronic substrate having improved properties.

SUMMARY OF THE INVENTION

The invention provides, a flexible electronic substrate (FES), a method of making an FES and devices incorporating an FES as defined in the appended independent claims, to which reference should now be made. Preferred or advantageous features of the invention are set out in various dependent sub-claims.

A FES may be provided comprising at least one flexible metallic layer having a flexible dielectric nanoceramic layer or coating and an electrical circuit formed on a surface of the nanoceramic coating. The nanoceramic coating comprises oxide of the metal layer material. For example, a FES may comprise a metallic layer, a dielectric nanoceramic layer formed at least in part by oxidation of a surface of the metallic layer, and an electrical circuit formed on a surface of the dielectric layer. The dielectric nanoceramic layer has a crystalline structure consisting of grains having an average grain size 100 nanometres or less, a thickness of between 1 micrometre and 50 micrometres, a dielectric strength of greater than 20 KV mm$^{-1}$, and a thermal conductivity of greater than 3 W/mK.

The nanoceramic layer has a crystalline structure having an average grain size of less than 100 nanometres. Such nanocrystalline structure provides the layer with a flexibility uncommon in ceramic materials. Such a nanoceramic layer also provides for high thermal conductivity, typically between 3 and 10 W/mK. The thickness of the coating is between 1 and 50 micrometres. In this thickness range the nanoceramic layer maintains flexibility, and may be repeatedly bent down to a bend radius of as low as 2 mm without deteriorating properties of the nanoceramic layer, such as thermal conductivity and dielectric strength. The nanoceramic layer has a combination of high dielectric strength of greater than 20 KV/mm and high thermal conductivity of greater than 3 W/mK with high flexibility, which is favourable for electronic applications.

The term "metallic" is used herein to describe broad classes of material. Thus, this term describes elemental metals such as pure aluminium, as well as alloys of one or more elements, and intermetallic compounds. Practically, the substrates used in the methods of the invention are likely to be commercially available metallic compositions. Many metals may be suitable for use as a metallic substrate on which the nanoceramic layer is formed to produce an FES. Suitable materials may include those metals classed as valve metals. An FES may be preferably formed from a substrate made from aluminium, magnesium, titanium, zirconium, tantalum, beryllium, or an alloy or intermetallic of any of these metals.

Preferably, the metallic layer has a thickness of between 5 micrometres and 2000 micrometres, preferably between 10 micrometres and 500 micrometres, or between 20 micrometres and 200 micrometres. Preferably the metallic layer is a metallic foil.

For FES applications, the dielectric strength of the nanoceramic layer is of particular importance. The nanoceramic layer according to any aspect of the present invention may, advantageously, provide a dielectric strength of greater than 25 kV mm$^{-1}$, or greater than 30 kV mm$^{-1}$, for example greater than 40 kV mm$^{-1}$, or greater than 50 kV mm$^{-1}$. Typically, the dielectric strength may be between 20 and 60 kV mm$^{-1}$.

For FES applications, it is preferred that the thermal conductivity of a dielectric layer is high. An insulating layer is required to provide electrical insulation between working electronic components and a metallic layer, and simultaneously to conduct heat away from the working electronic components into the metallic layer. It may be advantageous, therefore, that the dielectric nanoceramic layer of an FES according to any aspect of the invention has a thermal conductivity of greater than 3 W/mK, for example greater than 5 W/mK, or greater than 7 W/mK. Typically the nanoceramic layer has a thermal conductivity of between 3 and 10 W/mK, for example between 4 and 7 W/mK.

For some FES applications it may be preferred that the dielectric layer has a high dielectric constant. A high dielectric constant may be particularly preferred when the FES is intended to be used in RF or microwave applications. Preferably, the FES comprises a nanoceramic layer having a dielectric constant greater than 7, for example between 7.5 and 10.

Many physical properties of ceramic layers formed on a metal substrate are dependent to some extent on the crystallite size or grain size of the ceramic layer. A nanoceramic layer of an FES according to the present invention is a crystalline ceramic layer, and preferably the coating comprises grains having an average diameter of less than 100 nanometres, particularly preferably less than 80 nanometres, for example about 50 nanometres or 40 nanometres. Grains may be alternatively referred to as crystals or crystallites. The term grain size refers to the distance across the average dimension of a grain or crystal in the coating. Thus, an FES comprises a layer that may be described as a nanostructured layer, or a nanoceramic layer, as it has physical features that have a size or dimensions on the nanometre scale. Fine grain sizes may improve structural homogeneity and properties such as flexibility. Fine grain sizes may also increase thermal conductivity, dielectric strength and dielectric constant of a ceramic material. A smoother surface profile may also be developed as a result of the fine grain size. The flexibility of a nanoceramic layer may be influenced by the shape of grains within the nanoceramic layer. It is preferred that the grains are substantially equiaxed grains such that the nanoceramic layer does not possess anisotropic mechanical properties.

The dielectric nanoceramic layer preferably has substantially no pores having a diameter greater than 1 micrometre and an average pore size lower than 500 nanometres. Such a restriction in the pore dimensions may advantageously increase the dielectric strength and flexibility of the layer.

Flexibility of the FES may be defined by reference to a bend radius. Bend radius is a standard measurement of flexibility used to characterise materials in the form of wires, cables, and sheets. To measure the bend radius, a sheet is typically bent around rods or cylinders of decreasing diameter to determine the minimum curvature to which the sheet may be bent without damage. An FES is likely to be in the form of a sheet of material. As used herein, bend radius refers to a radius that a FES can be bent to repeatedly without damaging its properties. Minimum bend radius is the minimum curvature to which an FES can be bent without damaging its properties.

The minimum bend radius of a FES depends to some degree on the total thickness of the FES. Where the FES is of a high thickness (for example 2 mm) the minimum band radius may be high. For example the minimum bend radius is preferably lower than 25 cm, particularly preferably lower than 15 cm, or lower than 10 cm. For most applications the FES will have a total thickness of lower than 2 mm and the flexibility of the FES will be high. It is preferred that the minimum bend radius of the FES is lower than 20 mm, for example lower than 10 mm, or lower than 5 mm, for example between 2 mm and 5 mm.

A layer formed on a metallic substrate by an anodising process tends to be highly porous. Anodised layers or coatings also usually have an amorphous structure (i.e. anodised layers are rarely crystalline) and an open, column-like structure. The regular column-like structure of a typical anodic layer may render the coating susceptible to the formation of cracks, particularly after thermal cycling or bending of the layer. The susceptibility to crack formation limits the flexibility of anodic layers and, thus, limits the application of anodic layers as dielectrics in FESs.

Coatings or layers produced by Plasma Electrolytic Oxidation (PEO) processes are crystalline, but are not flexible. This is due to the inherent crack formation and large scale porosity associated with micro-spark discharge that is an essential element of a PEO process. PEO coatings cannot be used to form a dielectric layer of a FES.

The thickness of the nanoceramic layer is preferably less than 50 micrometres, and particularly preferably less than 20 micrometres or less than 10 micrometres. Nanoceramic layers with lower thickness demonstrate higher flexibility. The thinner the layers the more effective the thermal transfer across the layers, and thus it may be particularly advantageous if the layers have thicknesses in the range 1 or 2 micrometres to 10 micrometres.

It may be desirable to fill any pores that exist in the dielectric nanoceramic layer. Thus, an FES according to any aspect of the invention may comprise a nanoceramic layer that has been sealed or impregnated by a suitable organic or inorganic material to fill any pores in the layer. A suitable sealing material may be, for example, a resin, a fluoropolymer, a polyimide, a methacrylate, a polyester, a water glass, or a sol-gel material. This list of suitable sealing materials is not exhaustive and the skilled person would be able to identify other suitable materials. Sealing materials may be applied to the coating by a number of known methods, for example by dipping, spraying, vacuum sealing, and PVD and CVD deposition techniques.

A FES according to any aspect of the invention comprises an electrical circuit formed or built on the surface on nanoceramic layer. The electrical circuit may be formed by any conventional techniques such as screen printing, conductive ink printing, electroless metallisation, galvanic metallisation, adhesive bonding of metal foil, bonding of pre-fabricated flex circuits, chemical vapour deposition (CVD) and physical vapour deposition (PVD) metallisation.

The electrical circuit may be formed by the use of thermally conductive adhesives to bond metallic foils, such as copper foils, or pre-fabricated flex circuits to the nanoceramic layer formed as described above. Suitable thermally conductive adhesives may include resins, polyimides or fluoropolymers and others for bonding a metal layer to the surface of the coating. Bonding using adhesives may be accompanied by penetration of the bonding material to any pores of the coating. This penetration may create a composite dielectric layer having an increased breakdown voltage.

A FES may have a nanoceramic dielectric layer applied on one side or on both sides of a metallic substrate layer. Single sided organic FESs are in common use, and are technically and economically efficient. Two sided insulation is required, however, for fully insulated substrates and when an electrical circuit cannot be accommodated on one side of the substrate.

A FES may comprise conductive vias connecting an electrical circuit elements formed on a surface of the non-metallic coating with the metallic layer. Such vias may be formed by a masking process prior to the formation of the coating. Vias may be formed by an etching process after the coating has been formed or by laser ablation of the nanoceramic layer.

A protective coating layer may be formed over the electrical circuit.

A preferred embodiment of a FES that is particularly suitable for RF or microwave applications may comprise a metallic substrate having a dielectric nanoceramic layer formed on the surface of the metallic layer, in which the nanoceramic layer has a dielectric strength of greater than 20 KV mm$^{-1}$, a thickness of between 1 micrometre and 50 micrometres, a substantially equiaxed crystalline structure having an average grain size of less than 100 nanometres, and a dielectric constant greater than 7.

A preferred embodiment of a FES that is particularly suitable for high temperature applications may comprise a metallic substrate having a dielectric nanoceramic layer formed on the metallic layer and an electrical circuit built with completely with inorganic materials such as metals, for example by metal sputtering, electroless and galvanic metallisation. Such FESs have fully inorganic composition and can operate at temperatures above 300° C. Such FESs are not affected by thermal degradation inherent to an FES comprising plastic materials. A completely inorganic FES may be of particular interest for devices used, for example, in concentrated photovoltaics, thermoelectric energy harvesting, high brightness LEDs or sensors working at elevated ambient temperatures.

A FES as described above may be used for supporting one or more device selected from the list consisting of an electronic device, a flexible display, an OLED, a battery, an optoelectronic device, an RF device, a microwave device and an electrical device.

To form an FES according to any aspect of the invention a nanoceramic coating or layer possessing the desired properties is formed on a flexible metallic substrate and an electric circuit is formed on the nanoceramic layer.

A preferred method of forming a FES according to an aspect of the invention comprises the steps of positioning a flexible metallic sheet in an electrolysis chamber containing an aqueous alkaline electrolyte and an electrode, at least one surface of the flexible metallic sheet and a portion of the electrode contacting the aqueous electrolyte. At least a portion of the flexible metallic sheet associated with the at least one surface is tensioned, which may prevent the sheet from bending during formation of the nanoceramic layer. A dielectric nanoceramic layer is then formed by electrically biasing the at least one surface of the flexible metallic sheet with respect to the electrode, the at least one surface of the metallic sheet being biased by a sequence of voltage pulses of alternating polarity at a pulse repetition frequency of between 0.1 and 20 KHz. Positive voltage pulses are potentiostatically controlled, that is controlled with respect to voltage, and negative voltage pulses are galvanostatically controlled, that is controlled by reference to current.

After formation of the nanoceramic layer the flexible metallic sheet is removed from the electrolysis chamber. An electric circuit is then formed on a surface of the dielectric nanoceramic layer to form the FES.

By applying a sequence of voltage pulses of alternating polarity in which positive pulses are potentiostatically controlled and negative pulses are galvanostatically controlled, it is possible to apply pulses of high voltage to the substrate without inducing substantial levels of micro-discharge. By minimising or preferably completely avoiding micro-discharge events during the formation of the non-metallic coating, it may be possible to control coating parameters such as the surface roughness and the magnitude of the coating porosity. Thus, by controlling this process a coating may be formed having an average pore size lower than 500 nanometres, if desired. Micro-discharge may also be termed microspark discharge or microarcing. The presence of micro-discharge is an essential feature of a PEO coating process, but produces ceramic layers that are inherently not suitable for use in a FES. Thus, it is preferred that the nanoceramic coating is produced using a spark-less process.

It may be advantageous for the positive and negative voltage pulses to be shaped to avoid the development of current spikes during each voltage pulse. Current spikes are associated with the breakdown of the coating and with micro-discharge. By shaping the voltage pulses to avoid current spikes, micro-discharge may be reduced significantly or eliminated. As stated above, micro-discharge has a deleterious effect on a number of coating properties, for example on flexibility of the nanoceramic layer and on the average pore size of the layer and, as a consequence, on the dielectric strength of the layer.

It may be particularly advantageous if the shape of one or both of the positive and negative voltage pulses is substantially trapezoidal in shape.

The conversion of material in the flexible metallic sheet (the substrate) to form a nanoceramic layer occurs during the positive voltage pulses in which the substrate is anodically biased with respect to the electrode. The nanoceramic layer is formed as oxygen containing species in the aqueous electrolyte react with the substrate material itself. Over successive positive voltage pulses the nanoceramic layer increases in thickness. As the layer increases in thickness the electrical resistance of the layer increases and less current flows for the applied voltage. Thus, while it is preferred that the peak voltage of each of the positive voltage pulses is constant over the predetermined period, the current flow with each successive voltage pulse may decrease over the predetermined period.

As the nanoceramic layer grows in thickness, the resistance of the layer increases and, therefore, the current passing through the layer during each successive negative voltage pulse causes resistive heating of the layer. This resistive heating during negative voltage pulses may contribute to increased levels of diffusion in the layer, and may therefore assist the processes of crystallisation and grain formation within the developing layer. By controlling the formation of the layer in this manner, preferably in which micro-discharge is substantially avoided, a dense nanoceramic layer may be formed having crystallites or grain size of extremely fine scale.

The pulse repetition frequency of the voltage pulses may be between 0.1 and 20 KHz, preferably between 1.5 and 15 KHz, or between 2 and 10 KHz. For example, advantageous pulse repetition frequencies may be 2.5 KHz or 3 KHz or 4 KHz. At low pulse repetition frequencies the nanoceramic layer undergoes long period of growth followed by long periods of ohmic heating. The resulting nanoceramic layer may, therefore, have a more coarse structure or surface profile than if a higher pulse repetition frequency were to be used. Higher pulse repetition frequencies may produce finer structures and smoother nanoceramic layer surfaces, but formation rates and efficiency of the process may decrease.

The method is carried out in an electrolyte that is an alkaline aqueous solution, preferably an electrolyte having a pH of 9 or greater. Preferably, the electrolyte has an electrical conductivity of greater than 1 mS cm$^{-1}$. Suitable electrolytes include alkaline metal hydroxides, particularly those comprising potassium hydroxide or sodium hydroxide.

It may be particularly advantageous if the electrolyte is colloidal and comprises solid particles dispersed in an aqueous phase. Particularly preferably the electrolyte comprises a proportion of solid particles having a particle size of less than 100 nanometres. Particle size refers to the length of the largest dimension of the particle.

An electric field generated during the applied voltage pulses causes electrostatically charged solid particles dispersed in the aqueous phase to be transported towards the surface of the substrate on which the nanoceramic layer is growing. As the solid particles come into contact with the growing nanoceramic layer they may react with, and become incorporated into, the nanoceramic layer. Thus, where a colloidal electrolyte is used the nanoceramic layer may comprise both ceramic material formed by oxidation of a portion of the surface of the flexible metallic substrate and colloidal particles derived from the electrolyte.

The nanoceramic layer forming on the substrate is generated during the positive, anodic, voltage pulses. In order for the nanoceramic layer to grow a connection needs to be maintained between the substrate material and the electrolyte. The growing nanoceramic layer is not fully dense, but has a degree of porosity. The connection between the substrate material and the electrolyte is maintained via this porosity. Where the electrolyte is colloidal and comprises solid particles the porosity that is inherent in the formation of the nanoceramic layer may be substantially modified. Non-metallic solid particles dispersed in the aqueous phase may migrate under the electric field into pores of the growing nanoceramic layer. Once within the pores the solid particles may react, for example by sintering processes, with both the nanoceramic layer and with other solid particles that have migrated into the pores. In this way the dimensions of the pores are substantially reduced and the porosity of the nanoceramic layer is altered and develops as nanoporosity. For example, the maximum dimensions of pores in the nanoceramic layer may be reduced from 1 micrometre across to less than 400 nanometres across or less than 300 nanometres across.

By reducing the porosity, the density of the nanoceramic layer is increased. Furthermore, the reduction in the maximum dimensions of any porosity through the nanoceramic layer may substantially increase the dielectric strength and thermal conductivity of the nanoceramic layer.

The electrolyte may comprise solid particles that are present from the start of the process, i.e. the particles may be initially present in the electrolyte solution. Alternatively, solid particles may be added to the aqueous electrolyte during the nanoceramic layer formation process. In this way, the composition and/or structure of the growing nanoceramic layer may be controlled while the nanoceramic layer is growing.

An apparatus suitable for forming a nanoceramic layer on the surface of a flexible metallic sheet may comprise an electrolysis chamber for containing an aqueous electrolyte, at least one electrode locatable within the electrolysis chamber, and a power supply capable of applying a sequence of voltage pulses of alternative polarity between the metal sheet and the electrode. The power supply comprises a first pulse generator for generating a potentiostatically controlled sequence positive voltage pulses for anodically biasing the substrate with respect to the electrode. The power supply further comprises a second pulse generator for generating a galvanostatically controlled sequence of negative voltage pulses to cathodically bias the substrate with respect to the electrode.

It may be particularly advantageous that the apparatus further comprises a colloidal electrolyte comprising solid particles dispersed in an aqueous phase. The solid particles dispersed in such an electrolyte may become incorporated into the nanoceramic layer generated using the apparatus.

Preferably the metallic sheet is tensioned slightly during formation of the nanoceramic layer. This tensioning may help maintain the metallic sheet in a planar form and allow the nanoceramic layer to be formed evenly. In preferred embodiments, a metallic sheet may be supplied in the form of a roll of metallic sheet or foil. This foil may be unwound from the roll, continuously transported through the electrolysis chamber for formation of the nanoceramic layer, and then wound onto a second roll. Thus, the formation of the nanoceramic layer may proceed by means of a roll-to-roll mechanism.

In a further aspect, the invention may provide a device incorporating or mounted onto a FES according to any aspect above. A FES according to the invention has superior dielectric and thermal conductivity properties compared to prior art FESs, and devices mounted upon one may operate more efficiently due to the improved thermal transfer from components of the device through the FES. Such thermal transfer may be achieved by a combination of improved dielectric strength of the nanoceramic layer on the FES, which allows the nanoceramic layer to be thinner while providing electrical insulation, and an improved thermal conductivity of the material.

For certain applications, an FES having a multilayered structure may prove advantageous. For example, an FES may be formed according to any aspect or embodiment described above, and this FES may then form the base of a multilayered FES. An additional layer or layers of dielectric material and associated metal conducting layers may then be formed on the top of the base FES.

A FES as described herein may be of particular use as an insulated substrate for supporting a screen, for example and LED screen or a LCD screen.

PREFERRED EMBODIMENTS OF THE INVENTION

Preferred embodiments of the invention will now be described with reference to the figures, in which.

FIGS. 1 to 4 are schematic illustrations of different configurations of FES embodying the invention. The FESs all have a metallic layer, a nanoceramic layer and an electric circuit. The metallic layer may have thickness from 1 to 1000 micrometres, and this thickness is determined by the requirements of the FES such as thermal capacity and thermal resistance, minimum bend radius, and mechanical strength. The metal forming the metallic layer should preferably belong to the set of materials which can be treated by electrochemical conversion technology (for example as described in WO 2012/107754, the disclosure of which is incorporated in its entirety) to form a nano-crystalline metal oxide (nanoceramic) layer on the surface of the metallic layer, namely aluminium, magnesium, titanium, zirconium, tantalum, beryllium, or an alloy or intermetallic of any of these metals. A unique feature of the nanoceramic layer is its high degree of flexibility. It can be repeatedly bended or rolled down to a radius as low as of 2 mm. The thickness of nanoceramic layer may be varied from 1 to 50 micrometres and the required thickness of the nanoceramic layer is determined by the electric insulation requirements, such as required breakdown voltage. A method of forming a nanoceramic layer on a metallic layer is set out above. Once the nanoceramic layer has been formed on a surface of the metallic layer, an electrical circuit may be built on the surface of the nanoceramic layer by a conventional method such as screen printing, conductive ink printing, electroless metallisation, galvanic metallisation, adhesive bonding of metal foil, bonding of pre-fabricated flex circuits, metal sputtering, chemical vapour deposition (CVD) and physical vapour deposition (PVD) metallisation.

Figure 1:
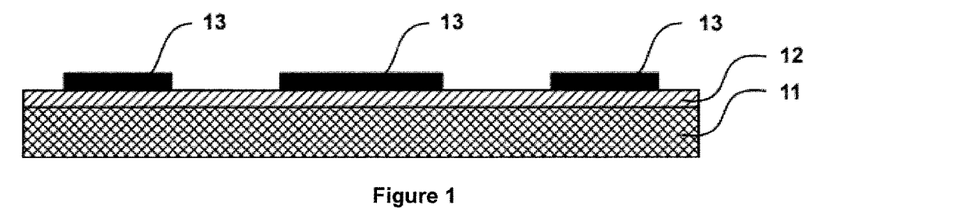
FIG. 1 is a side view of a FES embodying the invention, which comprises a metallic layer insulated with a dielectric nanoceramic layer applied on one side of metallic layer and an electrical circuit built on the nanoceramic layer.

FIG. 1 is a side view of a FES embodying the invention, which comprises a flexible metallic layer 11 insulated with a dielectric nanoceramic layer 12 formed on one side of the metallic layer 11. An electrical circuit 13 is built on the nanoceramic layer 12. The metallic layer is a layer 11 of pure industrial grade (99%) aluminium with a thickness of 300 microns. The nanoceramic coating was formed using electrochemical oxidation of the metallic layer in a colloidal electrolyte, as described above. The nanoceramic layer thickness was 12 microns.

The breakdown voltage of the nanoceramic layer was measured to be 400 V DC. The bend radius of the FES was determined by bending it repeatedly around a series of rods of decreasing radius. The minimum bending radius was determined to be 8 mm.

The electrical circuit 13 was built using metal sputtering through a photoresist mask. A Ti—Cu—Ni—Au system was applied. This system provides high adhesion to the nanoceramic layer, high electric conductivity, and is solderable and wire bondable. The FES of FIG. 1 is completely formed from inorganic materials and can withstand temperatures above 300° C. The Al metallic layer has a thermal conductivity of 200 W/mK and the nanoceramic layer has a thermal conductivity of 4 W/mK. The total thermal resistance of the FES is 0.04 Ccm2/W.

This FES provides 3 times lower thermal resistance than non-organic DBC (direct bonded copper) substrates made using a solid $Al_2O_3$ ceramic layer, which have thermal impedance of 0.15 Ccm2/W for a 300 micrometre thick substrate. The FES does not suffer from the brittleness of solid ceramic and if required can be bended to conform to the shape of a 3-D device, for example to a cylindrical shape. The FES of FIG. 1 could be used to support a thermoelectric device.

Figure 2:
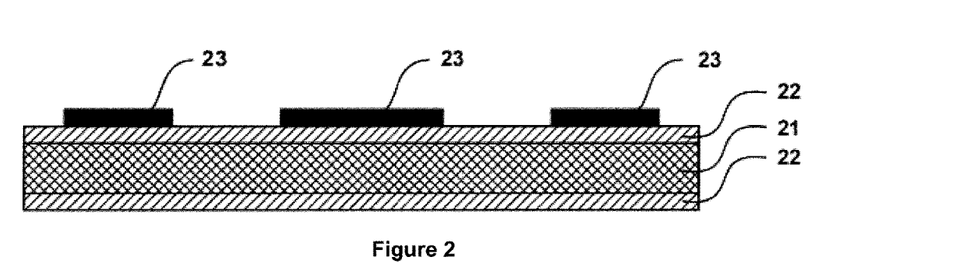
FIG. 2 is a side view of a FES embodying the invention, which comprises a metallic layer insulated with dielectric nanoceramic layers applied on both sides of metallic layer and an electrical circuit built on one of the nanoceramic layers.

FIG. 2 is a side view of a FES embodying the invention, on which a nanoceramic layer 22 is applied on both sides of a flexible metallic layer 21 to provide its full electric insulation. An electrical circuit 23 is built on one side of the substrate. The FES of FIG. 2 may be suitable for application in a flexible display which requires thermal management. The flexible metallic layer 21 is aluminium foil of AA 8014 grade Al and having a thickness of 50 microns. The nanoceramic layer 22 was formed on both sides of metal layer 21 (using the method described above) and the layer thickness was 10 microns.

On measurement it was determined that the nanoceramic layer provided electric insulation of 300 V DC. The FES of FIG. 2 was found to have a high degree of flexibility. It can be repeatedly bended or rolled down to a radius as low as of 4 mm.

An electrical circuit 23 was printed on the nanoceramic surface using an ink-jet printer. The fully insulated Al foil based FES of FIG. 2 was found to be compatible to roll-to-roll printed electronic technology.

Figure 3:
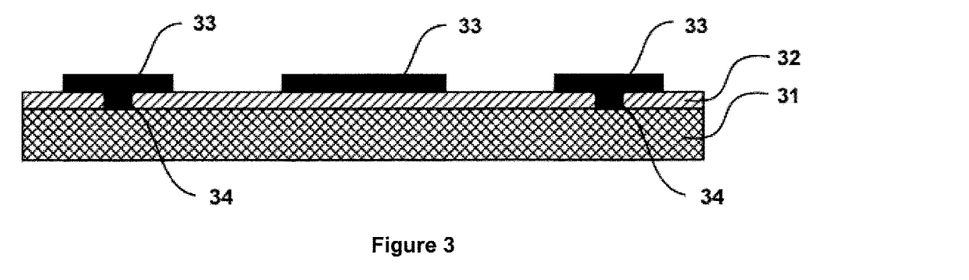
FIG. 3 is a side view of a FES embodying the invention, which comprises a metallic layer insulated with a dielectric nanoceramic layer applied on one side of metallic layer and an electrical circuit built on the nanoceramic layer-areas of the electric circuit are connected to the metallic layer by means of conductive vias.

FIG. 3 is a side view of a FES embodying the invention, which comprises a flexible metallic layer 31 insulated on one side with a dielectric nanoceramic layer 32 and an electrical circuit 33 built on the surface of nanoceramic layer 32. Areas of the electrical circuit 33 are connected with the metallic layer 31 by conductive vias 34. These vias provide thermal or electrical contact between devices supported by the FES and the metallic layer 31.

Figure 4:
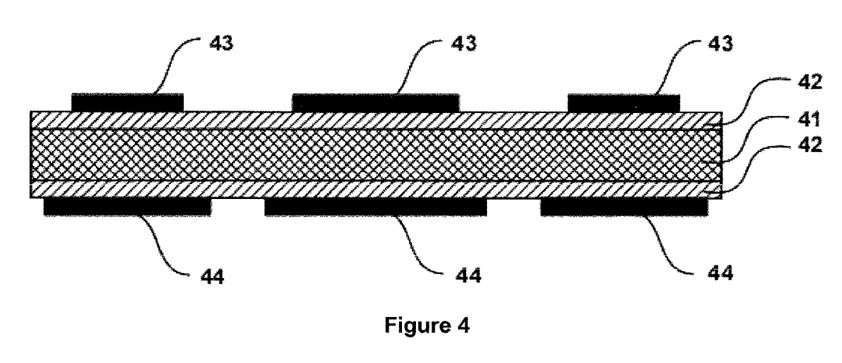
FIG. 4 is a side view of a FES embodying the invention, which comprises a metallic layer insulated with dielectric nanoceramic layers applied on both sides of the metallic layer and electrical circuits built on both nanoceramic layers.

FIG. 4 is a side view of a FES embodying the invention, which comprises a flexible metallic layer 41 which is insulated on both sides with dielectric nanoceramic layers 42 and electrical circuits 43, 44 built on the surface of nanoceramic layer 42. Such a FES may be used to support electrical interconnections with high density, which cannot be supported by a FES having a single dielectric layer.

The invention claimed is:

1. A flexible electronic substrate (FES) comprising:
a metallic layer having a thickness of between 5 micrometres and 200 micrometres:
a flexible dielectric nanoceramic layer formed at least in part by oxidation of a surface of the metallic layer; and
an electrical circuit formed on a surface of the flexible dielectric nanoceramic layer,
wherein the flexible dielectric nanoceramic layer has a crystalline structure that includes substantially equi-axed grains such that the flexible dielectric nanoceramic layer does not possess anisotropic mechanical properties, the the flexible dielectric nanceramic layer having an average grain size of 100 nanometres or less, a thickness of between 1 micrometre and 50 micrometres, a dielectric strength of greater than 20 KV $mm^{-1}$, and a thermal conductivity of greater than 3 W/mK, and
wherein the FES has a minimum bend radius that is lower than 20 mm.

2. A FES according to claim 1 wherein the metallic layer has a thickness of between 20 micrometres and 200 micrometres.

3. A FES according to claim 1, wherein the FES has a minimum bend radius of lower than 10 mm, with a minimum bend radius of between 2 mm and 5 mm being preferable.

4. A FES according to claim 1, further comprising conductive vias connecting parts of the electrical circuit with the metallic layer.

5. A FES according to claim 1, wherein the flexible dielectric nanoceramic layer includes a first flexible dielectric nanoceramic layer formed on a first surface of the metallic layer and a second flexible dielectric nanoceramic layer formed on a second surface of the metallic layer.

6. A FES according to claim 5, wherein the electrical circuit includes a first electrical circuit formed on a surface of the first flexible dielectric nanoceramic layer and a second electrical circuit formed on a surface of the second flexible dielectric nanoceramic layer.

7. A FES according to claim 1, wherein the metallic layer is formed of a material selected from a group of metals that includes aluminium, magnesium, titanium, zirconium, tantalum, and beryllium, or from an alloy of the group, or from an intermetallic of any of the metals of the group.

8. A FES according to claim 1, wherein the FES is formed entirely of inorganic materials.

9. A FES according to claim 1, wherein the FES has a maximum operating temperature in excess of 200° C., with a maximum operating temperature in excess of 250° C. being preferable.

10. A FES according to claim 1, wherein the flexible dielectric nanoceramic coating has a dielectric constant of greater than 7.

11. An FES according to claim 1, wherein the thickness of the flexible dielectric nanoceramic layer is less than 20 micrometres.

12. An FES according to claim 1, wherein the flexible dielectric nanoceramic coating is formed by electrochemical oxidation of the metallic layer in an alkaline colloidal electrolyte.

13. An FES according to claim 1, wherein the flexible dielectric nanoceramic layer is formed at least in part by sparkless oxidation of a surface of the metallic layer in an alkaline aqueous electrolyte.

14. An FES according claim 1, wherein the flexible dielectric nanoceramic layer has substantially no pores having a diameter greater than 1 micrometre and an average pore size lower than 500 nanometres.

15. An FES according to claim 1, wherein the electrical circuit is formed by one of: a screen printing process, a conductive ink printing process, a electroless metallization process, a galvanic metallization process, a process that includes adhesive bonding of metal foil, a process that includes bonding of pre-fabricated flex circuits, a metal sputtering process, a chemical vapour deposition (CVD) process, and a physical vapour deposition (PVD) metallization process.

16. An FES according to claim 1, wherein at least a portion of the flexible dielectric nanoceramic layer is impregnated with a polyimide material, a methacrylate material, an epoxy resin material, an acrylic resin material, or a sol-gel material.

17. A FES according to claim 1 further comprising a protective coating layer disposed over the electrical circuit.

18. A FES according to claim 1, wherein the FES is structured to support one or a combination of: an electronic device, a flexible display, an OLED, a battery, an optoelectronic device, an RF device, a thermoelectric device, a microwave device, and an electrical device.

19. A FES according to claim 1, wherein the FES is incorporated as part of a device.

20. A FES according to claim 1, wherein the FES is incorporated as part of a LCD screen or a LED screen.

21. A FES according to claim 1, wherein the FES is incorporated as part of a multilayered substrate.

22. A method of forming a flexible electronic substrate (FES) that includes: a metallic layer having a thickness of between 5 micrometres and 200 micrometres, a flexible dielectric nanoceramic layer formed at least in part by oxidation of a surface of the metallic layer, and an electrical circuit formed on a surface of the flexible dielectric nanoceramic layer, wherein the flexible dielectric nanoceramic layer has a crystalline structure that includes substantially equiaxed grains such that the flexible dielectric nanoceramic layer does not possess anisotropic mechanical properties, the flexible dielectric nanceramic layer having an average grain size of 100 nanometres or less, a thickness of between 1 micrometre and 50 micrometres, a dielectric strength of greater than 20 KV $mm^{-1}$, and a thermal conductivity of greater than 3 W/mK, and wherein the FES has a minimum bend radius that is lower than 20 mm, the method comprising steps of:
positioning a flexible metallic sheet in an electrolysis chamber containing an aqueous alkaline electrolyte and an electrode, at least one surface of the flexible metallic sheet and a portion of the electrode contacting the aqueous electrolyte, at least a portion of the flexible metallic sheet associated with the at least one surface being tensioned;
forming the flexible dielectric nanoceramic layer by electrically biasing the at least one surface of the flexible metallic sheet with respect to the electrode, the at least one surface of the metallic sheet being biased by a sequence of voltage pulses of alternating polarity at a pulse repetition frequency of between 0.1 and 20 KHz, wherein positive voltage pulses are potentiostatically controlled and negative voltage pulses are galvanostatically controlled;
removing the flexible metallic sheet with the flexible dielectric nanoceramic layer from the electrolysis chamber; and
forming the electric circuit on a surface of the flexible dielectric nanoceramic layer.

23. A method of forming a FES according to claim 22, wherein
the flexible metallic sheet is supplied as a first roll of material,
portions of the flexible metallic sheet that are unwound from the first roll of material have the flexible dielectric nanoceramic layer formed on at least one surface, and
a coated flexible metallic sheet having the flexible dielectric nanoceramic layer formed on at least one surface is wound into a second roll of material.

24. A method of forming a FES according to claim 22, wherein the step of forming the flexible dielectric nanoceramic layer on the at least one surface of the flexible metallic sheet involves a roll-to-roll processing.

25. A method of forming a FES according to claim 22, wherein the flexible nanoceramic coating is formed in part by an electrolytic oxidation process while the the flexible metallic sheet is in contact with an aqueous colloidal electrolyte, such that colloidal particles dispersed within the colloidal electrolyte are incorporated in the flexible nanoceramic coating.

26. A method of forming an FES according to claim 22, wherein the voltage pulses are controlled so as to avoid discharge of microsparks.

27. A method of forming an FES according to claim 22, wherein both the positive and negative voltage pulses are substantially trapezoidal in shape.

28. An RF device comprising:
a flexible electronic substrate (FES) that includes:
   a metallic layer having a thickness of between 5 micrometres and 200 micrometres,
   a flexible dielectric nanoceramic layer formed at least in part by oxidation of a surface of the metallic layer, and
   RF components and circuits formed on a surface of the flexible dielectric nanoceramic layer,
   wherein the flexible dielectric nanoceramic layer has a crystalline structure that includes substantially equi-axed grains such that the flexible dielectric nanoceramic layer does not possess anisotropic mechanical properties, the flexible dielectric nanceramic layer having an average grain size of 100 nanometres or less, a thickness of between 1 micrometre and 50 micrometres, a dielectric strength of greater than 20 $KV\,mm^{-1}$, and a thermal conductivity of greater than 3 W/mK, and
   wherein the FES has a minimum bend radius that is lower than 20 mm;
high-Q input/output transmission lines; and
RF de-coupling and matching circuits.

* * * * *